(12) United States Patent
Kim et al.

(10) Patent No.: US 7,884,409 B2
(45) Date of Patent: Feb. 8, 2011

(54) SEMICONDUCTOR DEVICE AND METHOD OF FABRICATING THE SAME

(75) Inventors: Yoon-Hae Kim, Seongnam-si (KR); Myoung-Hwan Oh, Hwaseong-si (KR); Myung-Soo Yeo, Yongin-si (KR); Hea-Yean Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 615 days.

(21) Appl. No.: 11/760,092

(22) Filed: Jun. 8, 2007

(65) Prior Publication Data

US 2008/0054329 A1 Mar. 6, 2008

(30) Foreign Application Priority Data

Jun. 8, 2006 (KR) ................... 10-2006-0051510

(51) Int. Cl.
- H01L 27/108 (2006.01)
- H01L 29/94 (2006.01)
- H01L 21/02 (2006.01)
- H01L 23/52 (2006.01)

(52) U.S. Cl. .............. 257/306; 257/303; 257/307; 257/532; 257/758

(58) Field of Classification Search .............. 257/306
See application file for complete search history.

(56) References Cited

U.S. PATENT DOCUMENTS

| | | | | |
|---|---|---|---|---|
| 5,649,804 A * | 7/1997 | Schychuck | .......... | 198/750.11 |
| 5,745,333 A * | 4/1998 | Frankeny et al. | .......... | 361/313 |
| 6,180,976 B1 * | 1/2001 | Roy | .......... | 257/306 |
| 6,731,494 B2 * | 5/2004 | Nakamura | .......... | 361/306.1 |
| 6,911,365 B2 * | 6/2005 | Nakamura | .......... | 438/255 |
| 6,919,244 B1 * | 7/2005 | Remmel et al. | .......... | 438/239 |
| 7,102,874 B2 * | 9/2006 | Jow et al. | .......... | 361/311 |
| 7,307,000 B2 * | 12/2007 | Choi | .......... | 438/393 |
| 7,317,221 B2 * | 1/2008 | Chang et al. | .......... | 257/306 |
| 2002/0155626 A1 * | 10/2002 | Park | .......... | 438/3 |
| 2004/0231885 A1 * | 11/2004 | Borland et al. | .......... | 174/260 |
| 2005/0006771 A1 * | 1/2005 | Akiyama | .......... | 257/758 |
| 2005/0116276 A1 * | 6/2005 | Gau | .......... | 257/306 |
| 2005/0153575 A1 * | 7/2005 | Lee et al. | .......... | 438/957 |
| 2007/0069384 A1 * | 3/2007 | Watanabe | .......... | 257/758 |

FOREIGN PATENT DOCUMENTS

| | | |
|---|---|---|
| JP | 2004-200640 | 7/2004 |
| KR | 1020000074908 A | 12/2000 |
| KR | 100389032 | 5/2002 |
| KR | 1020020039457 A | 5/2002 |
| KR | 1020020066090 A | 8/2002 |
| KR | 1020050079190 A | 8/2005 |

* cited by examiner

*Primary Examiner*—Scott B Geyer
*Assistant Examiner*—Pape Sene
(74) *Attorney, Agent, or Firm*—F. Chau & Associates, LLC

(57) ABSTRACT

A semiconductor device and methods of fabricating the same, wherein insulation layers are interposed to sequentially dispose the semiconductor device on a semiconductor substrate. The semiconductor device includes a first conductive plate, a second conductive plate, a third conductive plate, and a fourth conductive plate. At least two of the first second, third and fourth conductive plates are electrically connected and constitute at least two capacitors.

2 Claims, 16 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C §119 of Korean Patent Application 2006-0051510 filed on Jun. 8, 2006, the entirety of which is hereby incorporated by reference.

BACKGROUND

The present disclosure is related to a semiconductor device, more specifically, a semiconductor device including capacitors having high capacitance and method of fabricating the same.

A method of realizing a high-capacity capacitor for an analogue circuit and radio frequency (RF) device requiring high-speed operation is being developed. In case the lower electrode and upper electrode of a capacitor are made of doped polysilicon, however, oxidation occurs in the interface between the lower electrode and the dielectric layer, and in the interface between the dielectric layer and the upper electrode, to form a natural oxide layer. This causes a decrease of capacitance.

In an attempted solution to the above problem, a metal-insulator-metal (MIM) capacitor is introduced. An MIM capacitor has only a small, specific resistance and has no parasitic capacitance resulting from inner depletion. Therefore, the MIM capacitor is typically used in high-performance semiconductor devices. In addition, in an MIM capacitor it is relatively easy to control the capacitance, compared to a poly-insulator-poly (PIP) capacitor, and an MIM capacitor causes less difference in capacitance when varied according to frequency. Therefore, an MIM capacitor is widely used in analog-to-digital converters (ADC), high-frequency devices, switching capacitor filters, and CMOS image sensors, for example.

FIG. 1A illustrates a cross-sectional view showing a portion of a conventional MIM capacitor, and FIG. 1B illustrates a circuit diagram of the capacitor of FIG. 1A.

Referring to FIG. 1A and FIG. 1B, a lower electrode 30 and an upper electrode 40 are disposed on a semiconductor substrate 10 having a bottom interconnection 26. A dielectric 38 is interposed between the lower electrode 30 and the upper electrode 40. A first insulation layer 28 is disposed between the lower electrode 30 and the semiconductor substrate 10, and a second insulation layer 48 is disposed on the first insulation layer 28. First, second and third top interconnections 52, 54 and 56 are disposed in the second insulation layer 48. The first top interconnection 52 is electrically connected to the upper electrode 40 through a first contact 53, and the second top interconnection 54 is electrically connected to the lower electrode 30 through a second contact 55. The third top interconnection 56 is electrically connected to the bottom interconnection 26 through a third contact 57. As shown in FIG. 1B, the first top interconnection 52 is also electrically connected to a first external terminal A, and the second top interconnection 54 is electrically connected to a second external terminal B. The upper electrode 40 and the lower electrode 30 constitute a capacitor C1 shown in FIG. 1B.

A capacitance above a predetermined level is required for stable operation of a semiconductor device. However much area the capacitor occupies decreases due to a continuous scaling down of the semiconductor device, thereby to cause a corresponding decrease of capacitance. Accordingly, a capacitor having a high capacitance in a limited area is demanded.

SUMMARY OF THE INVENTION

Exemplary embodiments of the present invention are directed to semiconductor devices and methods of fabricating the same. In an exemplary embodiment of the present invention, a semiconductor device may comprise: a first conductive plate, a second conductive plate, a third conductive plate, and a fourth conductive plate stacked sequentially on a semiconductor substrate with an insulation layer interposed between the first and second conductive plates, between the second and third conductive plates, and between tire third and fourth conductive plates, respectively, the first to fourth plates overlapping each other, wherein at least two of the first to fourth plates are electrically connected to each other and constitute at least two capacitors.

In an exemplary embodiment, a semiconductor device may comprise: a semiconductor substrate having a first conductive plate; a second conductive plate disposed with a first insulation layer interposed on the first conductive plate; a third conductive plate disposed with a second insulation layer interposed on the second conductive plate; and a fourth conductive plate disposed with a third insulation layer interposed on the third conductive plate, wherein the first conductive plate and the third conductive plate are electrically connected to each other, and the second conductive plate and the fourth conductive plate are electrically connected to each other, and the first conductive plate and the second conductive plate constitute a first capacitor, the second conductive plate and the third conductive plate constitute a second capacitor, and the third conductive plate and the fourth conductive plate constitute a third capacitor.

Also, in an exemplary embodiment, a semiconductor device may comprise: a semiconductor substrate having a first conductive plate; a second conductive plate disposed with a first insulation layer interposed on the first conductive plate; a third conductive plate disposed with a second insulation layer interposed on the second conductive plate; and a fourth conductive plate disposed with a third insulation layer interposed on the third conductive plate, wherein the first conductive plate, the third conductive plate, and the fourth conductive plate are electrically connected, and the first conductive plate and the second conductive plate constitute a first capacitor, and the second conductive plate and the third conductive plate constitute a second capacitor.

In an exemplary embodiment, a semiconductor device may comprise: a semiconductor substrate having a first conductive plate; a second conductive plate disposed with a first insulation layer interposed on the first conductive plate; a third conductive plate disposed with a second insulation layer interposed on the second conductive plate; and a fourth conductive plate disposed with a third insulation layer interposed on the third conductive plate, wherein the first conductive plate, the second conductive plate, and the fourth conductive plate are electrically connected, and the second conductive plate and the third conductive plate constitute a first capacitor, and the third conductive plate and the fourth conductive plate constitute a second capacitor.

In an exemplary embodiment, a method of fabricating a semiconductor device may comprise: preparing a semiconductor substrate on which are formed a first conductive plate, a first bottom interconnection electrically connected to the first conductive plate, and a second bottom interconnection insulated from the first conductive plate; forming a second conductive plate with a first insulation layer interposed on the first conductive plate; forming a third conductive plate with a second insulation layer interposed on the second conductive plate; forming a third insulation layer on the semiconductor substrate; performing an etch process to form a first groove and a second groove, the first groove exposing the second bottom interconnection and the second conductive plate, and the second groove exposing the first bottom interconnection and the third conductive plate; and filling the first groove with conductive material to form a fourth conductive plate on the third conductive plate, wherein the first conductive plate and the third conductive plate are electrically connected, and the second conductive plate and the fourth conductive plate are electrically connected.

According to an exemplary embodiment, a method of fabricating a semiconductor device may comprise: preparing a semiconductor substrate on which are formed a first conductive plate, a first bottom interconnection electrically connected to the first conductive plate, and a second bottom interconnection insulated from, the first conductive plate; forming a second conductive plate with a first insulation layer interposed on the first conductive plate; forming a third conductive plate with a second insulation layer interposed on the second conductive plate; forming a third insulation layer on the semiconductor substrate; performing an etch process to form a first groove and a second groove, the first groove exposing the second bottom interconnection and the second conductive plate, and the second groove exposing die first bottom interconnection and the third conductive plate; and filling the first groove with conductive material to form a fourth conductive plate on the third conductive plate, wherein the first conductive plate, the third conductive plate and the fourth conductive plate are electrically connected.

In an exemplary embodiment, a method of fabricating a semiconductor device may comprise: preparing a semiconductor substrate on which are formed a first conductive plate, a first bottom interconnection electrically connected to the first conductive plate, and a second bottom interconnection insulated from the first conductive plate; forming a second conductive plate with a first insulation layer interposed on the first conductive plate; forming a third conductive plate with a second insulation layer interposed on the second conductive plate; forming a third insulation layer on the semiconductor substrate; performing an etch process to form a first groove and a second groove, the first groove exposing the second bottom interconnection and the third conductive plate, and the second groove exposing the first bottom interconnection and the second conductive plate; and filling the first groove with conductive material to form a fourth conductive plate on the third conductive plate, wherein the first conductive plate, the second conductive plate and the fourth conductive plate are electrically connected.

BRIEF DESCRIPTION OF THE DRAWINGS

Exemplary embodiments of the present invention will be understood in more detail from the following descriptions taken in conjunction with the accompanying drawings.

DETAILED DESCRIPTION OF EXEMPLARY EMBODIMENTS

Exemplary embodiments of the present invention will be described more fully hereinafter with reference to the accompanying drawings, in which exemplary embodiments of the invention are shown. This invention, however, may be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like numbers refer to like elements throughout.

Figure 1A:
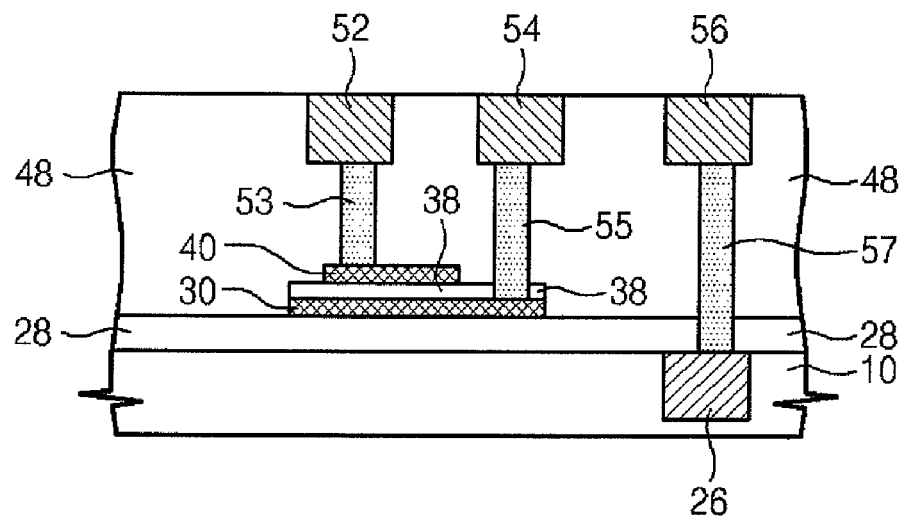
FIG. 1A is a cross-sectional view of a semiconductor showing a conventional MIM capacitor.
Figure 1B:
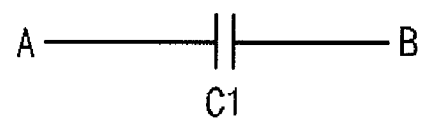
FIG. 1B is a circuit diagram, of the capacitor shown in FIG. 1A.
Figure 2:
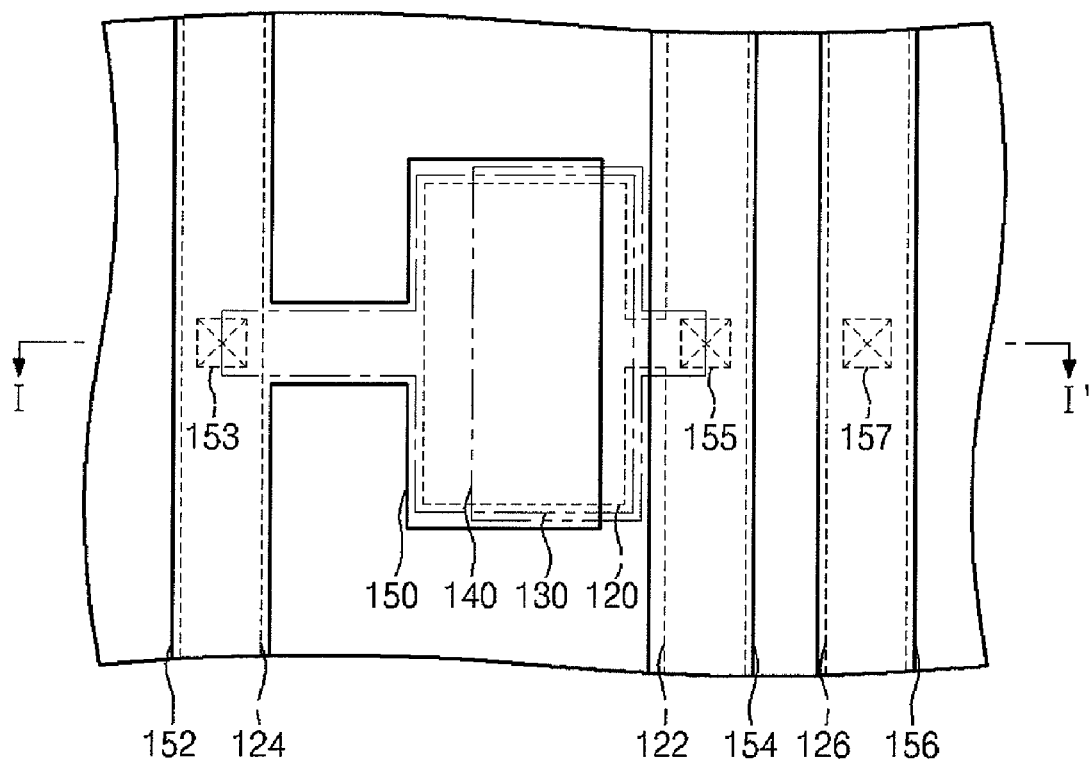
FIG. 2 is a plan view illustrating a semiconductor device according to an exemplary embodiment of the present invention.
Figure 3A:
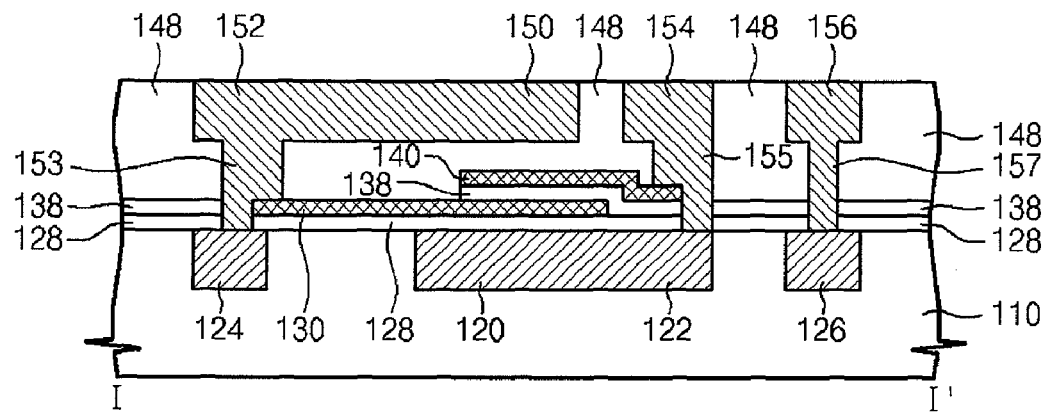
FIG. 3A illustrates a cross-sectional view cut along line I-I' of FIG. 2.
Figure 3B:
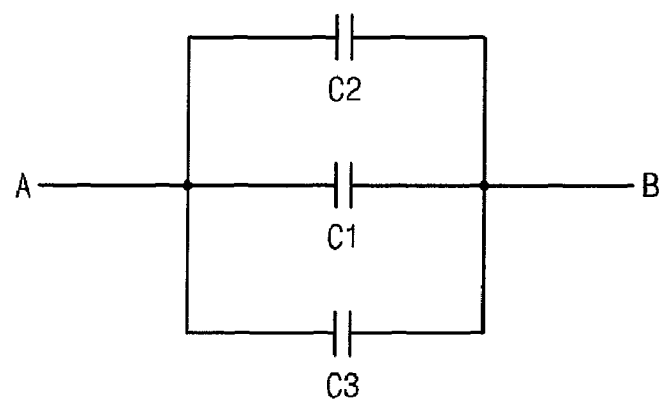
FIG. 3B is a circuit diagram of the capacitor shown in FIG. 3A.

FIG. 2 illustrates a plan view showing a semiconductor device according to an exemplary embodiment of the present invention. FIG. 3A illustrates a cross-sectional view cut along line I-I' of FIG. 2 and FIG. 3B is a circuit diagram of the device shown in FIG. 5A.

Referring to FIG. 2. FIG. 3A, and FIG. 3B, a second conductive plate 130, a third conductive plate 150 and a fourth conductive plate 140 are sequentially disposed on a semiconductor substrate 110 having a first conductive plate 120. The first conductive plate to the fourth conductive plate, 120, 130, 140 and 150, overlap with each other. A first insulation layer 128 is interposed between the first conductive plate 120 and the second conductive plate 130, a second insulation layer 138 is interposed between the second conductive plate 130 and the third conductive plate 140, and a third insulation layer 148 is interposed between the third conductive plate 140 and the fourth conductive plate 150.

The first conductive plate 120 and the fourth conductive plate 150 may be made of metal, such as copper, and the second conductive plate 130 and the third conductive plate 140 may be made of metal, such as Ti, TiN and TaN.

The first insulation layer 128 may function to prevent a metal from diffusing, and it may be made of a material, such as SiN, SiC or SiCN. The second insulation layer 138 may include a high-K dielectric material to increase its capacitance. The third insulation layer 148 is an interlayer dielectric or an inter-metal dielectric made of a material, such as $SiO_2$, SiOF or SiOC. A further insulation, layer (not shown) made of the same material as the first insulation layer 128 may be interposed between the third conductive layer 140 and the third insulation layer 148.

The semiconductor substrate 110 may include a first bottom interconnection 122, a second bottom interconnection 124 and a third bottom interconnection 126. The first, second and third bottom interconnections 122, 124, and 126 may be electrically connected to a transistor or an interconnection (not shown) placed under them. The first bottom interconnection 122 is electrically connected to the first conductive plate 120, and the second and the third bottom interconnections 124 and 126 are insulated from the first conductive plate 120.

A first top interconnection 152, a second top interconnection 154 and a third top interconnection 156 may be disposed in the third insulation layer 148 on the semiconductor substrate 110. The first, second and third top interconnections 152, 154, and 156 may be electrically connected to external terminals A and B, shown in FIG. 3B, that supply signal power to the semiconductor substrate. The first top interconnection 152 is electrically connected to the fourth conductive plate 150. And the second and the third top interconnections 154 and 156 are insulated from the fourth conductive plate 150.

The second bottom interconnection 124 and the first top interconnection 152, the first bottom interconnection 122 and the second top interconnection 154, and the first bottom interconnection 126 and the third top interconnection 156 are respectively electrically connected through a first contact 153, a second contact 155, and a third contact 157. Also, a second conductive plate 130 is electrically connected to the first contact 153, and a third conductive plate 140 is electrically connected to the second contact 155. Accordingly, the second conductive plate 130 and the fourth conductive plate 150 are electrically connected to each other, and the first conductive plate 150 and the third conductive plate 140 are electrically connected to each other. Also, the second conductive plate 130 and the fourth conductive plate 150 are electrically connected to the first external terminal A through the first top interconnection 152, and the first conductive plate 120 and the third conductive plate 140 are electrically connected to the second external terminal B through the second top interconnection 154.

The first to a fourth conductive plates 120, 130, 140 and 150 constitute three capacitors. The second conductive plate 130 and the third conductive plate 140, the third conductive plate 140 and the fourth conductive plate 150, and the first conductive plate 120 and the second conductive plate 130 respectively constitute a first capacitor C1, a second capacitor C2, and a third capacitor C3, shown in FIG. 3B. In other words, the first conductive plate 120 becomes a bottom electrode of the third capacitor C3, the second conductive plate 130 becomes a bottom electrode of the second capacitor C2, the third conductive plate 140 becomes a bottom electrode of the second capacitor C2, and the fourth conductive plate 150 becomes atop electrode of the second capacitor C2.

According to this exemplary embodiment, four conductive plates may constitute three capacitors connected in parallel. As a result, the semiconductor device may have capacitors having high capacitance. In case the second insulation layer is comprised of high-K dielectrics, the capacitance may be increased further.

Figure 4A:
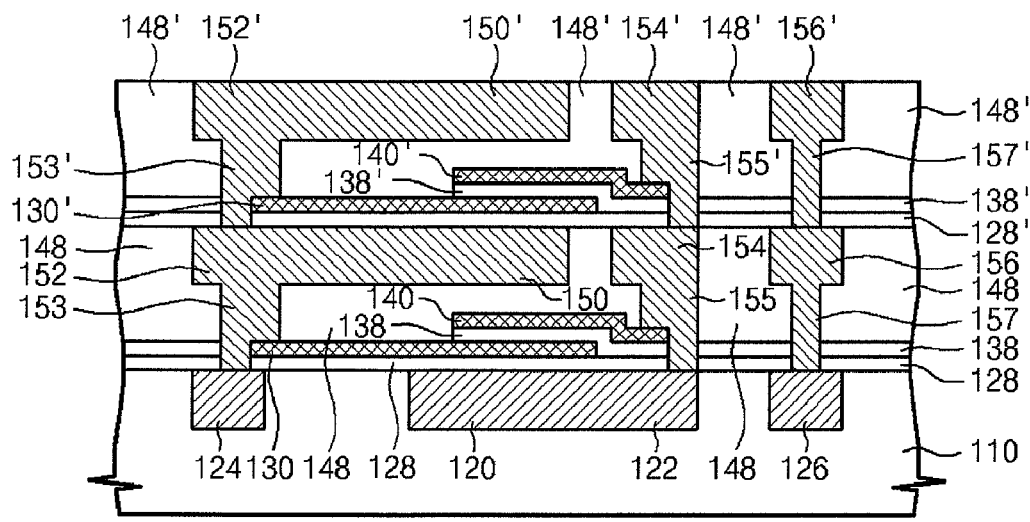
FIG. 4A is a cross-sectional view showing a semiconductor device of an exemplary embodiment of the present invention.
Figure 4B:
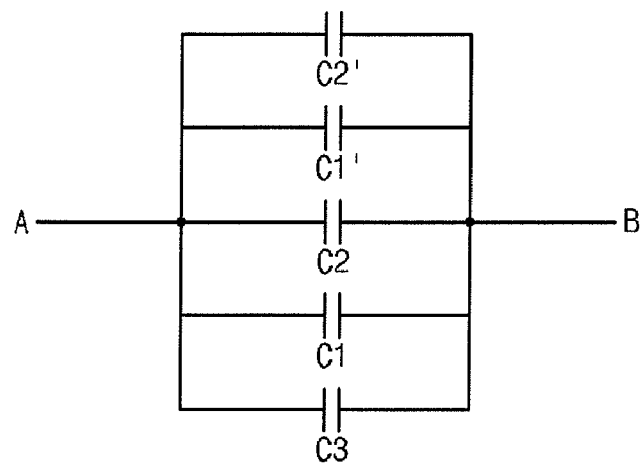
FIG. 4B is a circuit diagram of the device shown in FIG. 4A.

FIG. 4A illustrates a cross-sectional view showing a semiconductor device according to an exemplary embodiment of the present invention. FIG. 4B is a circuit diagram of the device shown in FIG. 4A.

Referring to FIGS. 4A and 4B, a fifth, a sixth and a seventh conductive plate 130', 140' and 150' may be disposed in the same construction with the construction of the second, third and fourth conductive plates 130, 140 and 150 formed on the substrate 110. Also, a fourth to a sixth insulation layer 128', 138' and 148' interposed between the fifth to the seventh conductive plates 130', 140' and 150' may be further disposed in the same construction with the construction of the first to the third insulation layers 128, 138 and 148.

The fifth conductive plate 130' and the sixth conductive plate 140' are made of metal, such as Ti, TIN and TaN. The seventh conductive plate 150' may be made of metal such as copper.

The fourth insulation layer 128' may function to prevent the metal from being diffused, and it may be made of a material, such as SiN, SiC and/or SiCN. The fifth insulation layer 138' may include a high-K dielectric material to increase capacitance. The sixth insulation layer 148' is an interlayer dielectric or inter-metal dielectric, and may be made of a material, such as SiO, SiOF and/or SiOC. An insulation layer made of the same material as the fourth insulation layer 128' may be farther interposed between the sixth conductive plate 140' and the sixth insulation layer 148'.

A fourth top interconnection 152', a fifth top interconnection 154' and a sixth top interconnection 156' may be disposed in the sixth insulation layer 148'. The fourth to sixth top interconnections 152', 154' and 156' may be respectively electrically connected to external terminals A and B, shown in FIG. 4B, that supply signal power to the semiconductor substrate. The fourth top interconnection 152' is electrically connected to the seventh conductive plate 150', and the fifth and the sixth top interconnections 154' and 156' are insulated from the seventh conductive plate 150'.

The first top interconnection 152 and the fourth top interconnection 152', the second top interconnection 154 and the fifth top interconnection 154', and the third top interconnection 156 and the sixth top interconnection 156' are respectively electrically connected through a fourth contact 153', a fifth contact 155' and a sixth contact 157'. Also, the fifth conductive plate 130' is electrically connected to the fourth contact 153', and the sixth conductive plate 140' is electrically connected to the fifth conductive plate 130'. Accordingly, the second conductive plate 130, the fourth conductive plate 150, the fifth conductive plate 130', and the seventh conductive plate 150' are electrically connected. And the first conductive plate 120, the third conductive plate 150, and the sixth conductive plate 140' are electrically connected. Also, the second conductive plate 130, the fourth conductive plate 150, the fifth conductive plate 130', and the seventh conductive plate 150' are electrically connected to the first external terminal A through the fourth top interconnection 152', and the first conductive plate 120, the third conductive plate 150, and the sixth conductive plate 140 are electrically connected to the second external terminal B through the fifth top interconnection 154'.

The first to seventh conductive plates 120, 130, 140, 150, 130', 140' and 150' constitute five capacitors. The first to the fourth conductive plates 120, 130, 140 and 150 constitute three capacitors, as shown in FIG. 38. In addition, the fifth conductive plate 130' and the sixth conductive plate 140', and the sixth conductive plate 140' and the seventh conductive plate 140' respectively further constitute a fourth capacitor C1' and a fifth capacitor C2'. In other words, the fifth conductive plate 130' becomes a bottom electrode of the fourth capacitor C1'. The sixth conductive plate 140' becomes a top electrode of the fourth capacitor C1' and becomes a bottom electrode of the fifth capacitor C2'. The seventh conductive plate 150' becomes a top electrode of the fifth capacitor C2'.

According to this exemplary embodiment, seven conductive plates may constitute five capacitors connected in parallel. As a result, the semiconductor device may include capacitors having high capacitance. In case the second insulation layer and the fifth insulation layer are formed of high-K dielectric material, the capacitance may be further increased. Also, the semiconductor device of the exemplary embodiment of the present invention may further include conductive plates disposed repeatedly in the same construction with the construction of the fifth to tire seventh conductive plates.

Figure 5:
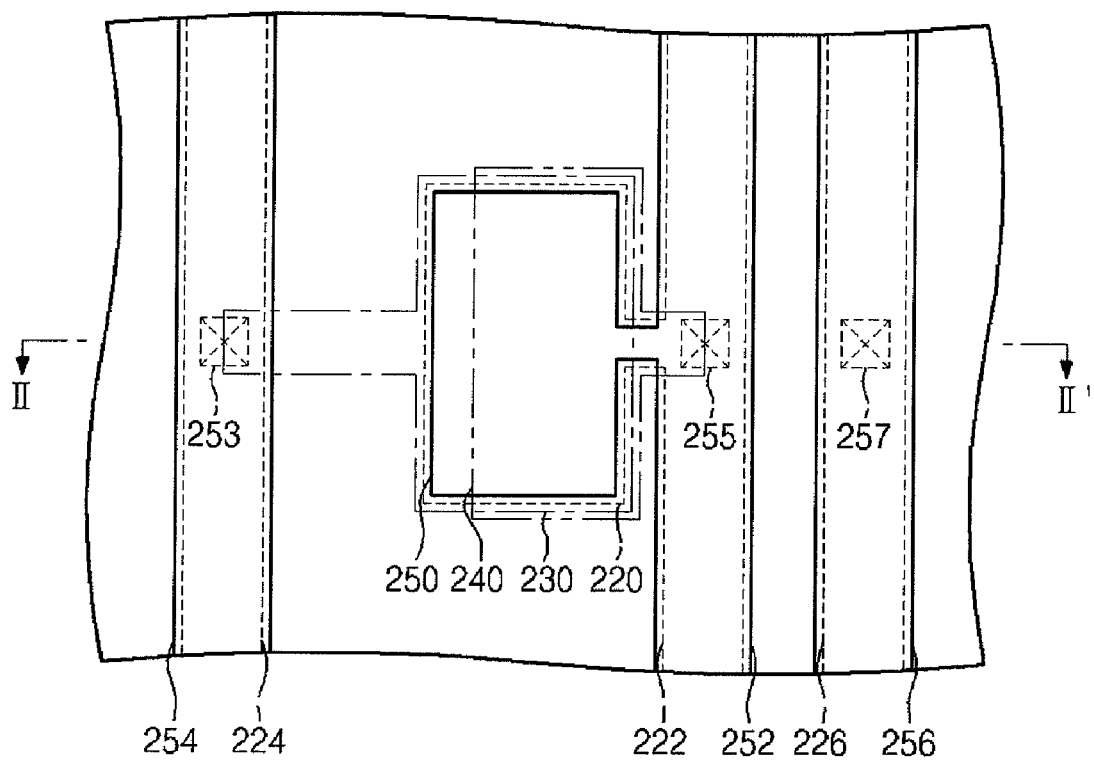
FIG. 5 is a plan view illustrating a semiconductor device according to an exemplary embodiment of the present invention.
Figure 6A:
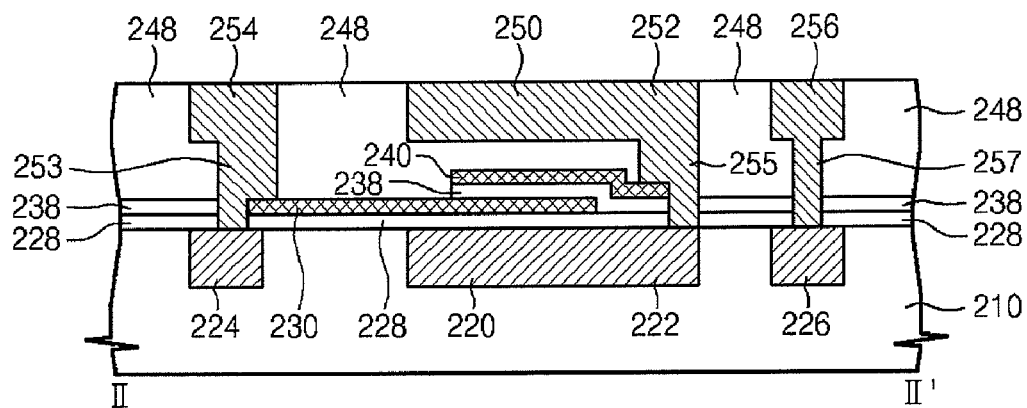
FIG. 6A illustrates a cross-sectional view cut along line II-II' of FIG. 5.

FIG. 5 illustrates a plan view showing briefly a semiconductor device according to an exemplary embodiment of the present invention. FIG. 6A illustrates a cross-sectional view cut along the line II-II' of FIG. 5. And FIG. 6B is a circuit diagram of the device shown in FIG. 6A.

Figure 6B:
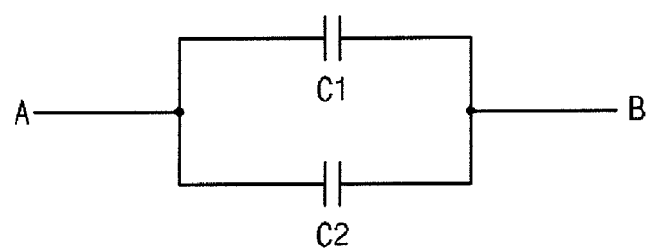
FIG. 6B is a circuit diagram of the device shown in FIG. 6A.

Referring to FIG. 5, FIG. 6A, and FIG. 6B, a second conductive plate 230, a third conductive plate 240, and a fourth conductive plate 250 are respectively disposed on a semiconductor substrate 210 having a first conductive plate 220 formed thereon. The first to fourth conductive plates 220, 230, 240 and 250 overlap with each other. A first insulation layer 228 is interposed between the first conductive plate 220 and the second conductive plate 230, a second insulation layer 238 is interposed between the second conductive plate 230 and the third conductive plate 240, and a third insulation layer 248 is interposed between the third conductive plate 240 and the fourth conductive plate 250.

The first conductive plate 220 and the fourth conductive plate 250 may be made of metal, such as copper, and the second conductive plate 230 and the third conductive plate 240 may be made of metal, such as Ti, TiN, and/or TaN.

The first insulation layer 228 may function to prevent the metal material from diffusing, and it may be made of material such as SiN, SiC, and/or SiCN. The second insulation layer 238 may include high-K dielectric material to increase capacitance. The third insulation layer 248 is an interlayer dielectric or an inter-metal dielectric, and may be made of $SiO_1$, SiOF and/or SiOC. A further insulation layer (not shown) made of the same material as the first insulation layer 228 may be interposed between the third conductive plate 240 and the third insulation layer 248.

The semiconductor substrate 210 may include a first bottom interconnection 222, a second bottom interconnection 224, and a third bottom interconnection 226. The first to third bottom interconnections 222, 224 and 226 may be electrically connected to a transistor or an interconnection placed in the semiconductor substrate under them. The first bottom interconnection 222 is electrically connected to the first conductive plate 220, and the second and the third bottom interconnections 224 and 226 are insulated from the first conductive plate 120.

A first top interconnection 252, a second top interconnection 254 and a third top interconnection 256 are disposed in the third insulation layer 248. The first to third top interconnections 252, 254 and 256 may be electrically connected to external terminals A and B, shown in FIG. 6B, that supply signal power to the semiconductor substrate. The first top interconnection 252 is electrically connected to the fourth conductive plate 250, and the second and the third top interconnections 254 and 256 are insulated from the fourth conductive plate 250.

The second bottom interconnection 224 and the second top interconnection 254, the first bottom interconnection 222 and the first top interconnection 252, and the third bottom interconnection 226 and the third top interconnection 256 are respectively electrically connected through a first contact 253, a second contact 155, and a third contact 257. Also, a second conductive plate 230 is electrically connected to the first contact 253, and a third conductive plate 240 is electrically connected to the second contact 155. Accordingly, the first conductive plate 220, the third conductive plate 240, and the third conductive plate 240 are electrically connected to each other. Also, the first conductive plate 220, the third conductive plate 240 and the fourth conductive plate 250 are electrically connected to a first external terminal A through the first top interconnection 252, and the second conductive plate 230 is electrically connected to a second external terminal B through the second top interconnection 254.

The first to fourth conductive plates 220, 230, 240 and 250 constitute two capacitors. The second conductive plate 230 and the third conductive plate 240, and the first conductive plate 220 and the second conductive plate 230 respectively constitute a first capacitor C1 and a second capacitor C2. Namely, the first conductive plate 220 becomes a bottom electrode of the second capacitor C2, the second conductive plate 230 becomes a top electrode of the second capacitor C2 and a bottom electrode of the first capacitor C1. The third conductive plate 240 becomes a top electrode of the first capacitor C1.

According to this exemplary embodiment, four conductive plates may constitute two capacitors connected in parallel. As a result, the semiconductor device may have capacitors having high capacitance. In case the second insulation layer is formed of high-K dielectric material, the capacitance may be further increased.

Figure 7A:
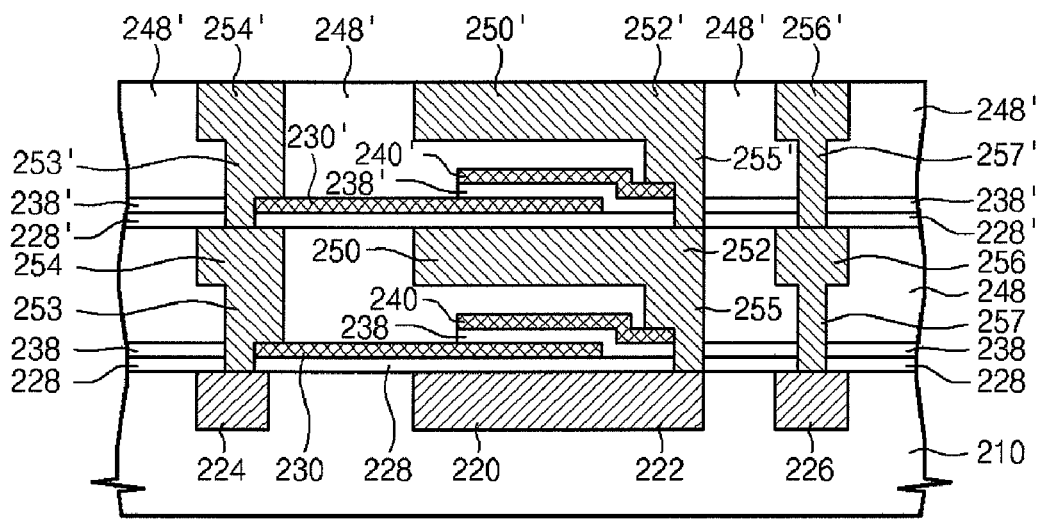
FIG. 7A illustrates a cross-sectional view showing a semiconductor device according to an exemplary embodiment of the present invention.
Figure 7B:
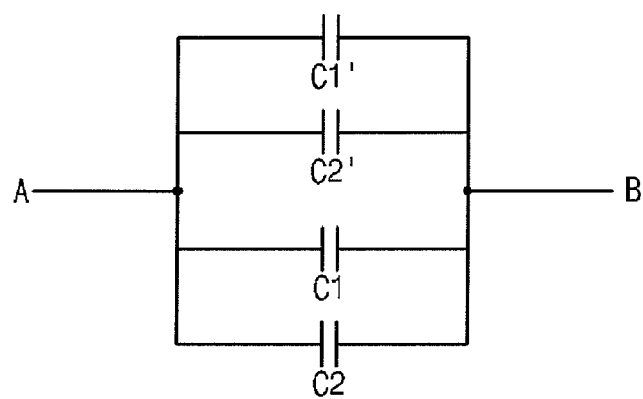
FIG. 7B is a circuit diagram of the device shown in FIG. 7A.

FIG. 7A illustrates a cross-sectional view of the semiconductor substrate showing a semiconductor device according to an exemplary embodiment of the present invention, and FIG. 7B is a circuit diagram of the device shown in FIG. 7A.

Referring to FIG. 7A and FIG. 7B, the fifth to the seventh conductive plates 230', 240' and 250' may be disposed in the same construction as the construction of the second to the fourth conductive plates 230, 240, and 250 formed on the substrate 210 of FIG. 6A. Also, a fourth to a sixth insulation layer 118', 238', and 248' interposed between the fifth to the seventh conductive plates 230', 240', and 250' may be disposed in the same construction as the first to the third insulation layers 228, 238, and 248.

The fifth conductive plate 230' and the sixth conductive plate 240' may be made of metal, such as Ti, TiN and/or TaN. The seventh conductive plate 250' may be made of metal, such as copper.

The fourth insulation layer 228' may function to prevent the metal material from diffusing and may be made of a material, such as SiN, SiC and/or SiCN. The fifth insulation layer 238' may include a high-K dielectric material to increase capacitance. The sixth insulation layer 248' is an interlayer dielectric or an inter-metal insulation layer and may be made of a material, such as SiO, SiOF and/or SiOC. A further insulation layer (not shown) made of the same material as the fourth insulation layer 228' may be interposed between the sixth conductive plate 240' and the sixth insulation layer 248'.

A fourth top interconnection 252', a fifth top interconnection 254', and a sixth top interconnection 256' may be disposed in the insulation layer 248'. The fourth to tire sixth insulation layers 252', 254' and 256' may be respectively electrically connected to external terminals A and B, shown in FIG. 7B, that supply signal power to the semiconductor substrate. The fourth top interconnection 252' is electrically connected to the seventh conductive plate 250', and the fifth and the sixth top interconnection 254' and 256' are insulated from the seventh conductive plate 250'.

The second top interconnection 254 and the fifth top interconnection 254', the first top interconnection 254 and the fourth top interconnection 252', and the third top interconnection 256 and the sixth top interconnection 256' are respectively electrically connected through a fourth contact 253', a fifth contact 255', and a sixth contact 257', Also, the fifth conductive plate 230' is electrically connected to the fourth contact 253', and tire sixth conductive plate 240' is electrically connected to the fifth contact 255'. Accordingly, the first conductive plate 220, the third conductive plate 240, the fourth conductive plate 250, the sixth conductive plate 240' and the seventh conductive plate 250' are electrically connected, and the second conductive plate 230 and the fifth conductive plate 230' are electrically connected. Also, the first conductive plate 220, the third conductive plate 240, the fourth conductive plate 250, the sixth conductive plate 240' and the seventh conductive plate 250' are electrically connected to the first external terminal A through the fourth top interconnection 252'. The second conductive plate 230 and the fifth conductive plate 230' are electrically connected to the second external terminal B through the fifth top interconnection 254'.

The first to the seventh conductive plates 220, 230, 240, 250, 230', 240' and 250' constitute four capacitors. The first to fourth plates 220, 230, 240 and 250 constitute two capacitors, as shown in FIG. 6B. In addition, in this exemplary embodiment, the fifth conductive plate 230' and the sixth conductive plate 240' further constitute a third capacitor C1', and the fourth conductive plate 250 and the fifth conductive plate 230' constitute a fourth capacitor C2'. More specifically, the fourth conductive plate 250 becomes the bottom electrode of the fourth capacitor C2', the fifth conductive plate 230' becomes the bottom electrode of the third capacitor C1', and the sixth conductive plate 240' becomes the top electrode of the third capacitor C1'.

According to this exemplary embodiment, seven conductive plates constitute four capacitors connected in parallel. Therefore, the semiconductor device may include capacitors having high capacitance. In case the second insulation layer and the fifth insulation layer are formed, of high-K dielectric material, the capacitance may be further increased. Also, a semiconductor device according an exemplary embodiment of the present invention may further include conductive plates disposed repeatedly in the same construction as the construction of the fifth to the seventh conductive plates.

Figure 8:
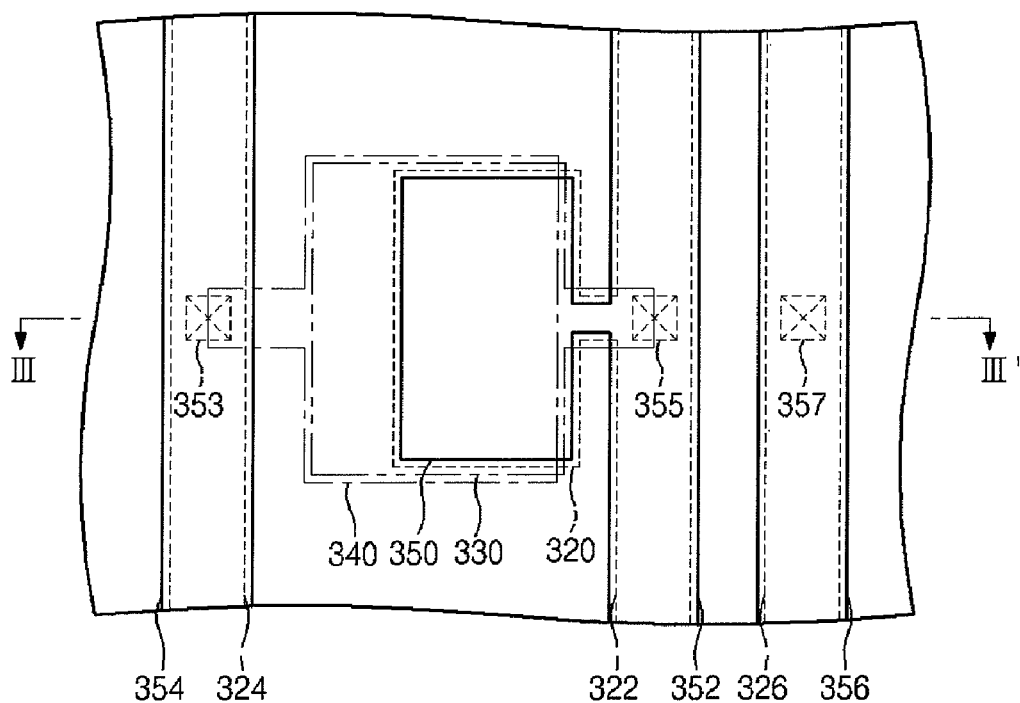
FIG. 8 is a plan view showing a semiconductor device according to an exemplary embodiment of the present invention.
Figure 9A:
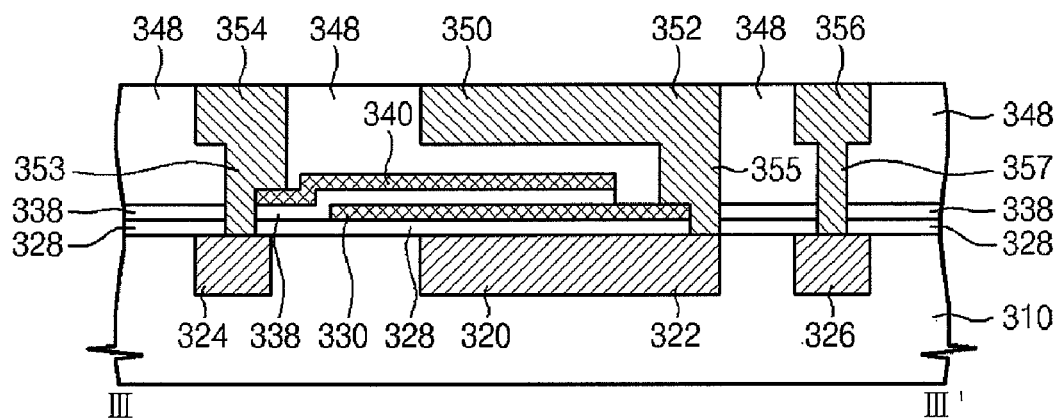
FIG. 9A illustrates a cross-sectional view cut along line III-III' of FIG. 8.

FIG. 8 is a plan view showing a semiconductor device according to an exemplary embodiment of the present invention. FIG. 9A illustrates a cross-sectional view cut along the line III-III' of FIG. 8, and FIG. 9B is a circuit diagram of the device shown in FIG. 9A.

Figure 9B:
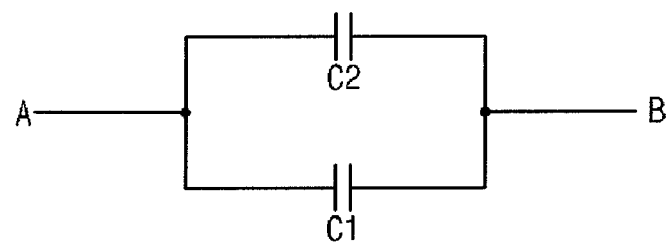
FIG. 9B is a circuit diagram of the device shown in FIG. 9A.

Referring to FIG. 8, FIG. 9A and FIG. 9B, a second conductive plate 330, a third conductive plate 340, and a fourth conductive plate 350 are respectively disposed on the semiconductor substrate 310 having a first conductive plate 320. The first to the fourth conductive plates 320, 330, 340, and 350 overlap with each other. A first insulation layer 328 is interposed between the first conductive plate 320 and the second conductive plate 330, a second insulation layer 338 is interposed between the first and the third conductive plates 330 and 340, and a third insulation layer 348 is interposed between the third and the fourth conductive plates 340 and 350.

The first and tire fourth conductive plates 320 and 350 may be made of metal such as copper, and the second and the third conductive plates 330 and 340 may be made of metal such as Ti, TiN and TaN.

The first insulation layer 328 may function to prevent the metal from diffusing, and it may be made of a material such as SiN, SiC or SiCN. The second insulation layer 338 may include a high-K dielectric material to increase capacitance. The third insulation layer 348 is an interlayer dielectric or an inter-metal dielectric, made of a material such as $SiO_1$, SiOF or SiOC. A further insulation layer (not shown) made of the same material as the first insulation layer 328 may be interposed between the third conductive layer 340 and the third insulation layer 348.

The semiconductor substrate 310 may include a first bottom interconnection 322, a second bottom interconnection 324, and a third bottom interconnection 326. The first to third bottom interconnections 322, 324, and 326 may be electrically connected to a transistor or an interconnection located in the semiconductor substrate 310 under them. The first bottom interconnection 322 is electrically connected to the first conductive plate 320, and the second and third bottom interconnection 324 and 326 are insulated from the first conductive plate 320.

A first top interconnection 352, a second top interconnection 354, and a third top interconnection 356 may be disposed in the third insulation layer 348. The first, second and third top interconnections 352, 354, and 356 may be electrically connected to external terminals A and B, shown in FIG. 9B, that supply signal power to the semiconductor substrate. The first top interconnection 352 is electrically connected to the fourth conductive plate 350. And the second and the third top interconnections 354 and 356 are insulated from the fourth conductive plate 350.

The second bottom interconnection 324 and the second top interconnection 354, the first bottom interconnection 322 and the first top interconnection 352, and the third bottom interconnection 326 and the third top interconnection 356 are respectively electrically connected through a first contact 353, a second contact 355, and a third contact 357. Also, a third conductive plate 340 is electrically connected to the first contact 353, and a second conductive plate 330 is electrically connected to the second contact 355. Accordingly, the first conductive plate 320, the second conductive plate 330, and the fourth conductive plate 350 are electrically connected. Also, the first, second, and fourth conductive plates 320, 330, and 350 are electrically connected to the first external terminal A through the first top interconnection 352, and the third conductive plate 340 is electrically connected to the second external terminal B through the second top interconnection 354.

The first to fourth conductive plates 320, 330, 340, and 350 constitute two capacitors. The second conductive plate 330 and the third conductive player 340, the third conductive plate 340 and the fourth conductive plate 350, respectively constitute a first capacitor C1 and a second capacitor C2. In other words, the second conductive plate 330 becomes a bottom electrode of the first capacitor C1, the third conductive plate 340 becomes a top electrode of the first capacitor C2, and it becomes a bottom electrode of the second capacitor C2, and the fourth conductive plate 350 becomes a top electrode of the second capacitor C2.

According to this exemplary embodiment, four conductive plates may constitute two capacitors connected in parallel. As a result, the semiconductor device may have capacitors having high capacitance. In case the second insulation layer is formed, of high-K dielectric material, the capacitance may be increased further.

Figure 10A:
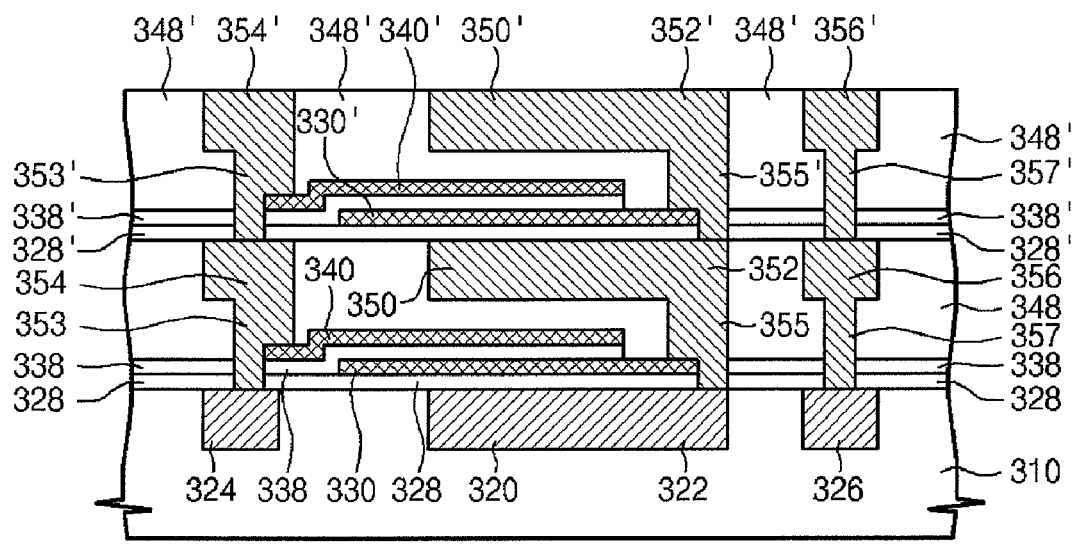
FIG. 10A illustrates a cross-sectional view of a semiconductor substrate showing a semiconductor device of an exemplary embodiment of the present invention.
Figure 10B:
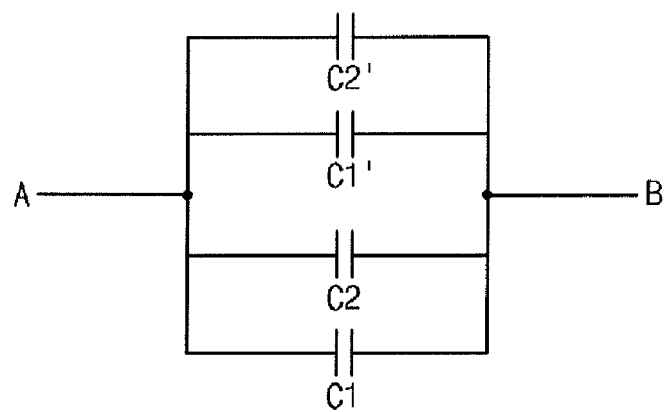
FIG. 10B is a circuit diagram of the device shown in FIG. 10A.

FIG. 10A illustrates a cross-sectional view of a semiconductor substrate showing a semiconductor device according to an exemplary embodiment of this invention. FIG. 10B is a circuit diagram of the device shown in FIG. 10A.

Referring to FIG. 10A and FIG. 10B, the fifth to the seventh conductive plates 330', 340' and 350' may be disposed in the same construction as the construction of the second to the fourth conductive plates 330, 340, and 350 on the substrate 310 shown in FIG. 6A. Also, a fourth to a sixth insulation layer 318', 338' and 348' interposed between the fifth to the seventh conductive plates 330', 340' and 350' may be disposed in the same construction as the first to third insulation layers 328, 338, and 348.

The fifth and the sixth conductive plates 330' and 340' may be made of metal, such as Ti, TiN and/or TaN. The seventh conductive plate 350' may be made of metal, such as copper.

The fourth insulation layer 328' may function to prevent the metal material from diffusing and may be made of material, such as SiN, SiC and/or SiCN. The fifth insulation layer 338' may include a high-K dielectric material to increase capacitance. The sixth insulation layer 348' is an interlayer dielectric or an inter-metal insulation layer and may be made of material, such as SiO, SiOF and/or SiOC. A further insulation layer (not shown) made of the same material as the fourth insulation layer 328' may be interposed between the sixth conductive plate 340' and the sixth insulation layer 348'.

A fourth top interconnection 352', a fifth top interconnection 354', and a sixth top interconnection 356' may be disposed in the sixth insulation layer 348'. The fourth to sixth top interconnections 352', 354' and 356' may be respectively electrically connected to external terminals A and B, shown in FIG. 10B, that supply signal power to the semiconductor substrate. The fourth top interconnection 352' is electrically connected to the seventh conductive plate 350', and the fifth and sixth top interconnections 354' and 356' are insulated from the seventh conductive plate 350'.

The second top interconnection 354 and the fifth top interconnection 354', the first top interconnection 352 and the fourth top interconnection 352', and the third top interconnection 356 and the sixth top interconnection 356' are respectively electrically connected through a fourth contact 353', a fifth contact 355', and a sixth contact 357'. Also, the fifth conductive plate 330' is electrically connected to the fifth contact 355', and the sixth conductive plate 340' is electrically connected to the fourth contact 353'. Accordingly, the first conductive plate 320, the third conductive plate 330, the fourth conductive plate 350, the fifth conductive plate 330', and the seventh conductive plate 350' are electrically connected. The third conductive plate 340 and the sixth conductive plate 340' are electrically connected. Also, the first conductive plate 320, the second conductive plate 330, the fourth conductive plate 350, the fifth conductive plate 330' and the seventh conductive plate 350' are electrically connected to the first external terminal A through the fourth top interconnection 352'. The third and the fifth conductive plates 340 and 340' are electrically connected to the second external terminal B through the fifth top interconnection 354'.

The first to seventh conductive plates 320, 330, 340, 350, 330', 340' and 350' constitute four capacitors. The first, to fourth plates 320, 330, 340 and 350 constitute two capacitors, as shown in FIG. 9B. In addition, in this exemplary embodiment, the fifth conductive plate 330' and the sixth conductive plate 340' further constitute a third capacitor C1', and the sixth conductive plate 340' and the seventh conductive plate 350' constitute a fourth capacitor C2'. More specifically, the fifth conductive plate 330' becomes the bottom electrode of the third capacitor C1', the sixth conductive plate 340' becomes the top electrode of the third capacitor C1', and the sixth conductive plate 240' becomes the top electrode of the third capacitor C1'.

According to this exemplary embodiment, seven conductive plates constitute four capacitors connected in parallel. Therefore, the semiconductor device may include capacitors having high capacitance. In case the second insulation layer and the fifth insulation layer are a high-K dielectric material, the capacitance may be further increased. Also, a semiconductor device according to an exemplary embodiment of the present invention may further include conductive plates disposed repeatedly in the same construction as the construction of the fifth to the seventh conductive plates.

in the above-described exemplary embodiments, the conductive plates and the interconnections may further include a barrier metal layer capable of preventing the metal from being diffused.

FIGS. 11 to 14 illustrate cross-sectional view cut along the line I-I' of FIG. 2 to describe a method of fabricating a semiconductor device according to an exemplary embodiment of the present invention.

Figure 11:
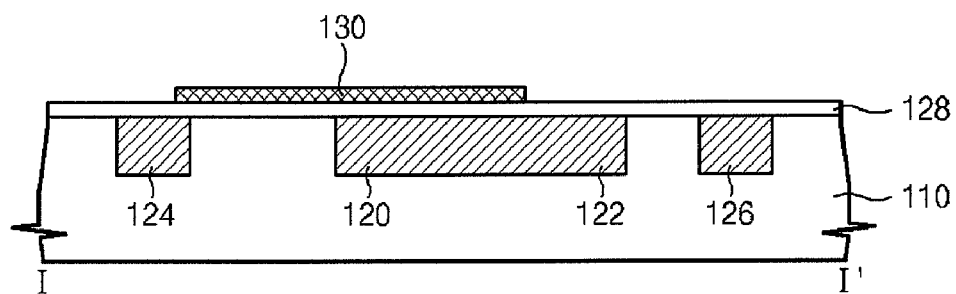
FIG. 11 to FIG. 14 illustrate cross-sectional views cut along the line I-I' of FIG. 2 to describe a method of fabricating a semiconductor device of an exemplary embodiment of the present invention.

Referring to FIGS. 2 and 11, a first insulation layer 128 is formed on the semiconductor substrate 110 where a first conductive plate 120 and a first to third bottom interconnections 122, 124, and 126 are formed. The semiconductor substrate may include an active device, such as transistor. The first conductive plate 120 and the first to third bottom interconnections 122, 124, and 126 may be made of metal, such as copper. The first insulation layer 128 may be made of a material, such as SiN, SiC, and/or SiCN, which is capable of preventing metal from being diffused. A second conductive plate 130 is formed so that it overlaps with the first conductive plate 120 on the first insulation layer 128 and may be made of metal such as Ti, TiN, and/or TaN.

Figure 12:
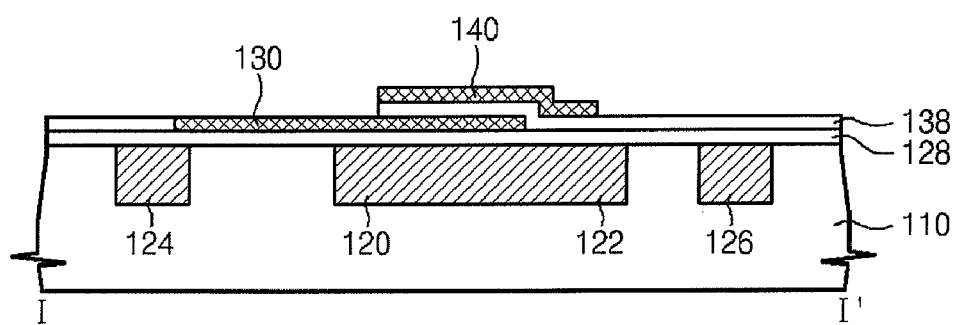

Referring to FIGS. 2 and 12, a second insulation layer 138 and a third conductive plate 140 are formed on the second conductive plate 130. The second insulation layer 138 may be made of a silicon insulation layer, such as $SiO_2$, SiN, and/or SiON or a metal insulation layer such as $Ta_2O_5$, HfO, $Al_2O_3$. A high-k dielectric material may be used in order to increase capacitance. The third conductive plate 140 is formed so that it overlaps the second conductive plate 130, and may be made of metal such as Ti, TiN or TaN.

Figure 13:
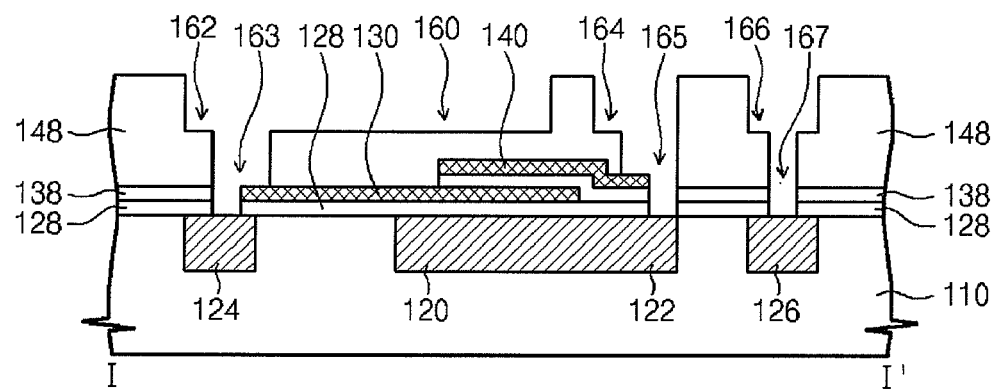

Referring to FIGS. 2 and 13, a third insulation layer 148 is formed on the entire surface of a semiconductor substrate 110. The third insulation layer 148 may be made of $SiO_2$, SiOF or SiOC. The third insulation layer 148 may be referred to as an interlayer dielectric or an inter-metal dielectric. Before forming the third insulation layer 148, an insulation layer (not shown) that functions to prevent metal from being diffused may further be formed on the conductive plate 140.

After that, an etch process is performed to form, a plate-type groove 160, line-type grooves 162, 164, and 166, and first to third contact holes 163, 165 and 167. A second bottom interconnection 124 and a second conductive plate 130 are exposed through the first contact hole 163. A bottom interconnection 122 and a third conductive plate 140 are exposed through the second contact hole 165, and a third bottom interconnection 126 is exposed through the third contact hole 167. During the etching process, the first to the third bottom interconnections 122, 124 and 126 may function as etch stop layers. Accordingly, over etching may be prevented in the etch process, and short circuits between the bottom interconnections and/or between bottom interconnection and other interconnections placed under them may be prevented. In other words, the capacitors may be formed stably.

Figure 14:
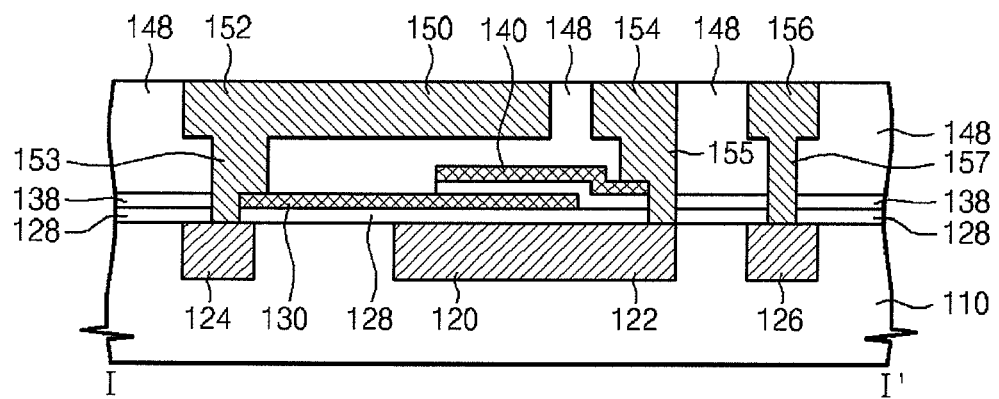

Referring to FIG. 2 and FIG. 14, grooves 160, 162, 164 and 166 and the first to third contact holes 153, 155 and 157 may be filled with metal to form first to third top interconnections 152, 154 and 156, and form first to third contacts 153, 155 and 157. The method to form interconnections by filling metal material in an etched insulation layer may be referred to as the damascene process. Material such as copper may be used for the metal material.

A second bottom interconnection 124, a second conductive plate 130, a first top interconnection 152, and a fourth conductive plate 150 are electrically connected through the first contact 153. Also, a first conductive plate 120, a third conductive plate 140, and a second top interconnection 154 are electrically connected through the second contact 155. Even though the first and the second contacts 153 and 155 are made of copper, if the second and the third conductive plates 130 and 140 are made of Ti, TIN, or TaN, it is possible to prevent the copper included in the first and the second contacts 153 and 155 from being diffused into the second and the third conductive plates 130 and 140. A third bottom interconnection 126 and a third top interconnection 156 may be electrically connected through the third contact 157.

FIGS. 15 to 18 illustrate cross-sectional views cut along the line II-II' of FIG. 5 to describe a method of fabricating a semiconductor device according to an exemplary embodiment of the present invention.

Figure 15:
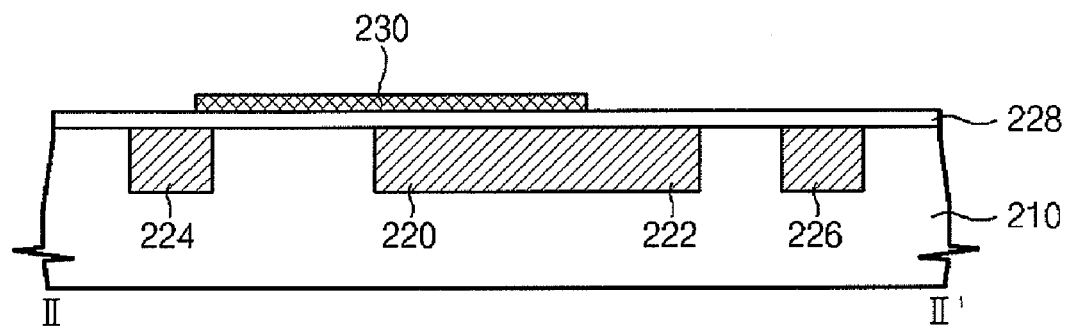
FIG. 15 to FIG. 18 illustrate cross-sectional views cut along the line II-II' of FIG. 5 to describe a method of fabricating a semiconductor device of an exemplary embodiment of the present invention.

Referring to FIG. 5 and FIG. 15, a first insulation layer 228 is formed on a semiconductor substrate 210 where first to third bottom interconnections 222, 224, and 226 are formed. The second conductive plate 230 is formed so that it overlaps with the first conductive plate 220 on the first insulation layer 228.

Figure 16:
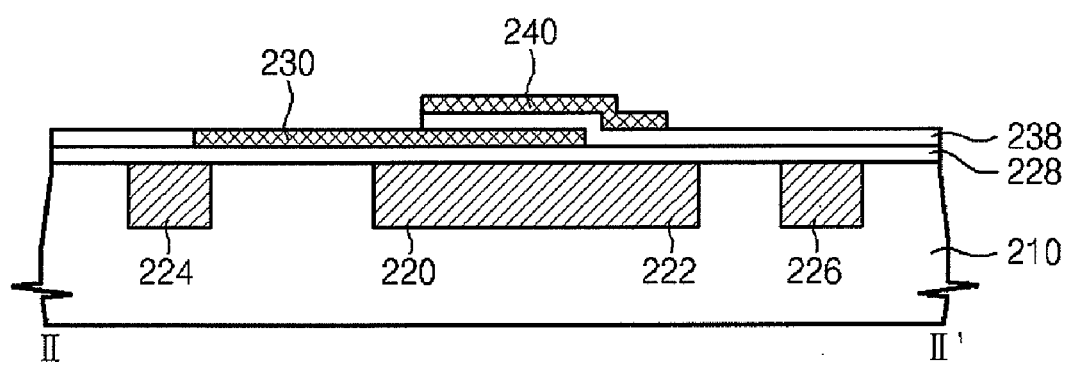

Referring to FIG. 5 and FIG. 16, a second insulation layer 238 and a third conductive plate 240 are formed on the second conductive plate 230. The second insulation layer 238 may be made of a high-K dielectric material in order to increase capacitance. The third conductive plate 240 is formed so that it overlaps with the second conductive plate 230.

Figure 17:
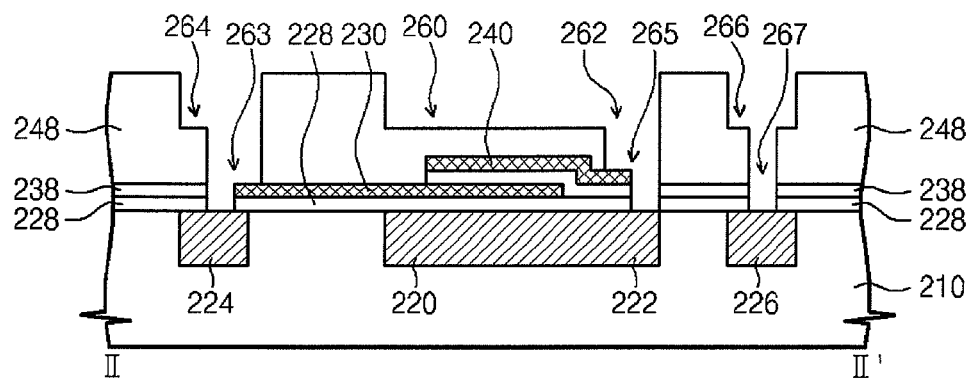

Referring to FIG. 5 and FIG. 17, a third insulation layer 248 is formed on the entire surface of the semiconductor substrate 210. Before forming the third insulation layer 248, an insulation layer (not shown) that functions to prevent metal from being diffused, such as the first insulation layer 128, may further be formed on the third conductive plate 240.

Subsequently, an etching process is performed to form a plate-type groove 260, line-type grooves 262, 264, and 266, and first to third contact holes 263, 265, and 267. A second bottom interconnection 224 and a second conductive plate 230 are exposed through the first contact hole 263. A bottom interconnection 222 and a third conductive plate 240 are exposed through the second contact hole 265, and a third bottom interconnection 226 is exposed through the third contact hole 267. During the etch process, the first to the third bottom interconnections 222, 224 and 226 may function as etch stop layers.

Figure 18:
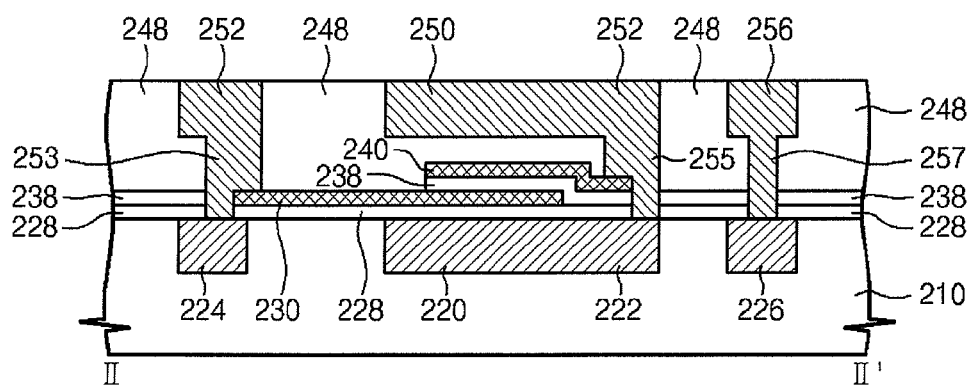

Referring to FIG. 5 and FIG. 18, grooves 260, 262, 264, and 266 and the first to third contact holes 253, 255, and 257 are filled with metal to form a fourth conductive plate 250, first to third top interconnections 252, 254 and 256, and form first to third contacts 253, 255 and 257.

A second bottom interconnection 224, a second conductive plate 230, and a second top interconnection 254 are electrically connected through the first contact 253. Also, a first conductive plate 220, a third conductive plate 240, a first top interconnection 252 and a fourth conductive plate 250 are electrically connected through the second contact 255. A third bottom, interconnection 226 and a third top interconnection 256 are electrically connected through the third contact 257.

FIG. 19 to FIG. 22 illustrate cross-sectional views cut along the line III-III' of FIG. 8 to describe a method of fabricating a semiconductor device according to an exemplary embodiment of the present invention.

Figure 19:
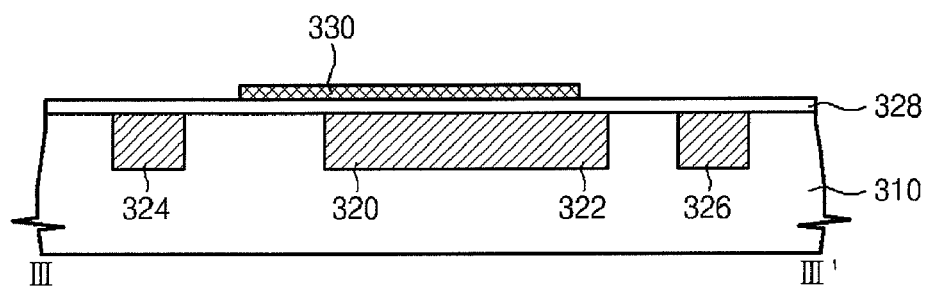
FIG. 19 to FIG. 22 illustrate cross-sectional views cut along the line III-III' of FIG. 8 to describe a method of fabricating a semiconductor device of an exemplary embodiment of the present invention.

Referring to FIG. 8 and FIG. 19, a first insulation layer 328 is formed on a semiconductor substrate 310 where a first conductive plate 320 and first to third bottom interconnections 322, 324 and 326 are formed. A second conductive plate 330 is formed so that it overlaps with the first conductive plate 320 on the first insulation layer 328.

Figure 20:
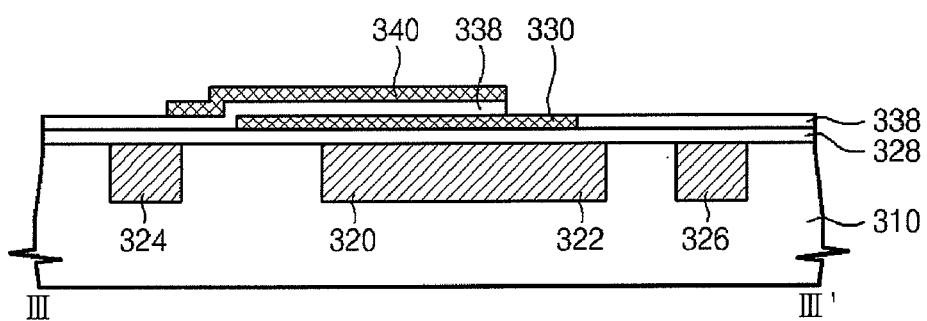

Referring to FIG. 8 and FIG. 20, a second insulation layer 338 and a third conductive plate 340 are formed on the second conductive plate 330. The second insulation layer 338 may be made of a high-K dielectric material in order to increase capacitance. The third conductive plate 340 is formed, so that it overlaps with the second conductive plate 330.

Figure 21:
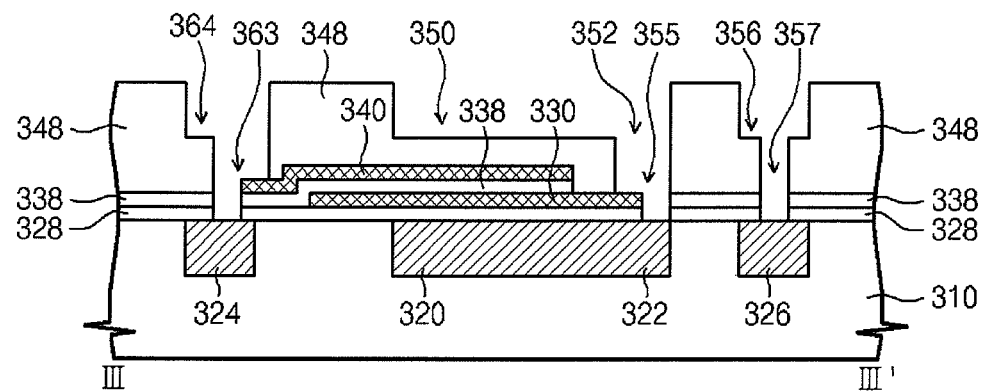

Referring to FIG. 8 and FIG. 21, a third insulation layer 348 is formed on the entire surface of a semiconductor substrate. Before forming the third insulation layer 348, an insulation layer (not shown) functioning to prevent metal from being diffused, like the first insulation layer 128, may further be formed on the third conductive plate 140.

Next, an etch process is performed to form a plate-type groove 360, line-type grooves 362, 365, and 367, and first to third contact holes 363, 365 and 367. A second bottom interconnection 324 and a third conductive plate 340 are exposed through the first contact hole 363. A bottom interconnection 322 and a second conductive plate 330 are exposed through the second contact hole 365, and a third bottom interconnection 326 is exposed through the third contact hole 367. During the etch process, the first to the third bottom interconnections 322, 324, and 326 may function as etch stop layers.

Figure 22:
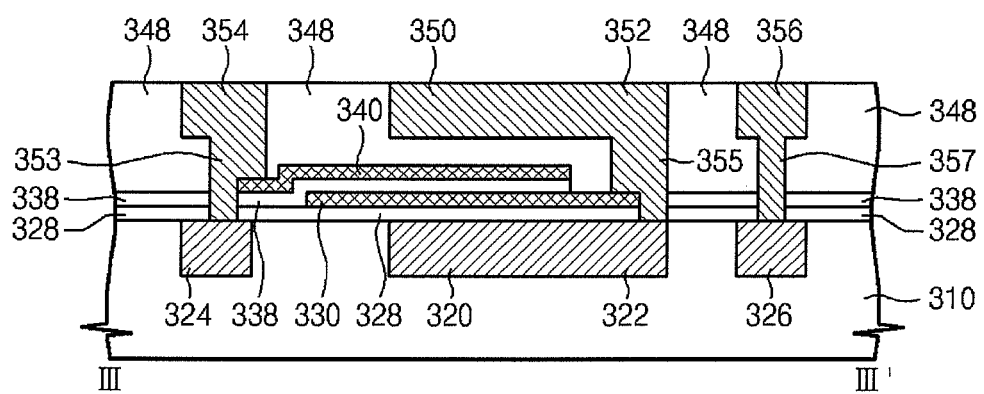

Referring to FIG. 8 and FIG. 22, grooves 360, 362, 364, and 366 and the first to third contact holes 353, 355, and 357 are filled with metal to form a fourth conductive plate 350, and first to third top interconnections 352, 354 and 356 and to form first to third contacts 353, 355 and 357.

A second bottom interconnection 324, a third conductive plate 340, and a second conductive plate 340 are electrically connected through the first contact 353. Also, a first conductive plate 320, a second conductive plate 330, a first top interconnection 352, and a fourth conductive plate 350 are electrically connected through the second contact 355. A third bottom interconnection 326 and a third top interconnection 356 may be electrically connected through the third bottom interconnection 326.

In the above-described exemplary embodiments, before or after forming the conductive plates and interconnections, a barrier metal layer that prevents metal of the conductive plates and interconnections from being diffused may further be formed.

Although the present invention has been described in connection with the exemplary embodiments illustrated in the accompanying drawings, it is not limited thereto. It will be apparent to those of ordinary skill in the art that various substitutions, modifications and changes may be made thereto without departing from the scope and spirit of the invention.

According to exemplary embodiments of the present invention, the semiconductor device may include capacitors having high capacitance.

According to exemplary embodiments of the present invention, the capacitors may be formed stably.

What is claimed is:

1. A semiconductor device comprising:
   a semiconductor substrate having a first conductive plate;
   a second conductive plate disposed with a first insulation layer interposed on the first conductive plate;
   a third conductive plate disposed with a second insulation layer interposed on the second conductive plate;
   a fourth conductive plate disposed with a third insulation layer interposed on the third conductive plate,
   a bottom interconnection disposed on one side of the first conductive plate, the bottom interconnection being insulated from the first conductive plate;
   a top interconnection disposed on one side of the fourth conductive plate, the top interconnection being insulated from the second conductive plate; and
   a first contact electrically connecting the bottom interconnection and the top interconnection;
   and a second contact electrically connecting the first conductive plate and the fourth conductive plate,
   wherein the first conductive plate, the third conductive plate, and the fourth conductive plate are electrically connected, the first conductive plate and the second conductive plate constitute a first capacitor, and the second conductive plate and the third conductive plate constitute a second capacitor; and
   wherein the second conductive plate is electrically connected to the first contact, and the third conductive plate is electrically connected to the second contact, the first conductive plate and the bottom interconnection are placed at the same level in the semiconductor substrate, and the fourth conductive plate and the top interconnection are placed at the same level on the semiconductor substrate.

2. A semiconductor device comprising:
   a semiconductor substrate having a first conductive plate;
   a second conductive plate disposed with a first insulation layer interposed on the first conductive plate;
   a third conductive plate disposed with a second insulation layer interposed on the second conductive plate;
   a fourth conductive plate disposed with a third insulation layer interposed on the third conductive plate,
   a bottom interconnection disposed on one side of the first conductive plate, the bottom interconnection being insulated from the first conductive plate;
   a top interconnection disposed on one side of the fourth conductive plate, the top interconnection being insulated from the second conductive plate;
   a first contact electrically connecting the bottom interconnection and the top interconnection; and
   a second contact electrically connecting the first conductive plate and the fourth conductive plate,
   wherein the first conductive plate, the second conductive plate, and the fourth conductive plate are electrically connected, the second conductive plate and the third conductive plate constitute a first capacitor, and the third conductive plate and the fourth conductive plate constitute a second capacitor; and
   wherein the second conductive plate is electrically connected to the second contact, and the third conductive plate is electrically connected to the first contact, the first conductive plate and the bottom interconnection are placed at the same level in the semiconductor substrate, and the fourth conductive plate and the top interconnection are placed at the same level on the semiconductor substrate.

* * * * *